United States Patent
Okumura et al.

[11] Patent Number: 5,943,637
[45] Date of Patent: Aug. 24, 1999

[54] NOISE ANALYZING APPARATUS FOR ANALYZING NOISE OF AUTONOMOUS SYSTEM BY SIMULATION

[75] Inventors: Makiko Okumura, Fujisawa; Hiroshi Tanimoto, Kawasaki, both of Japan

[73] Assignee: Kabushiki Kaisha Toshiba, Kawasaki, Japan

[21] Appl. No.: 08/773,129

[22] Filed: Dec. 26, 1996

[30] Foreign Application Priority Data

Dec. 27, 1995 [JP] Japan ..................... 7-341934

[51] Int. Cl.⁶ ........................................ G06F 9/06
[52] U.S. Cl. ........................... 702/111; 702/117
[58] Field of Search ................ 702/57, 66, 85, 702/86, 106, 107, 109, 111, 117–124, 189–191

[56] References Cited

U.S. PATENT DOCUMENTS

| | | | |
|---|---|---|---|
| 4,067,060 | 1/1978 | Poussart et al. | 702/110 |
| 4,509,132 | 4/1985 | Kavaya | 702/109 |
| 4,792,913 | 12/1988 | Buckland et al. | 364/602 |
| 5,025,402 | 6/1991 | Winkelstein | 364/578 |
| 5,663,890 | 9/1997 | Saleh et al. | 364/490 |

OTHER PUBLICATIONS

Andy Howard, "Simulate Oscillator Phase Noise", Microwaves & RF, pp. 64–70, Nov. 1993.

*Primary Examiner*—John Barlow
*Assistant Examiner*—Craig Steven Miller
*Attorney, Agent, or Firm*—Oblon, Spivak, McClelland, Maier & Neustadt, P.C.

[57] ABSTRACT

A noise analyzing apparatus includes an input unit for inputting a structure of an autonomous system, parameter values and analysis conditions, a periodic steady-state solution calculating unit for calculating a periodic steady-state solution of the autonomous system, a noise source adding unit for adding a noise source to a periodic linear time-variant system obtained by linearizing the autonomous system around the periodic steady-state solution, a time-variant transfer function calculating unit for calculating, for each noise source, a time-variant transfer function of the periodic linear time-variant system to which noise sources are added, a reflected component calculating unit for adding power of a time-variant transfer function reflected to a frequency to be observed, and an output unit for outputting as a result of analysis relating to noise based on results of calculations by the above-described calculating units.

18 Claims, 7 Drawing Sheets

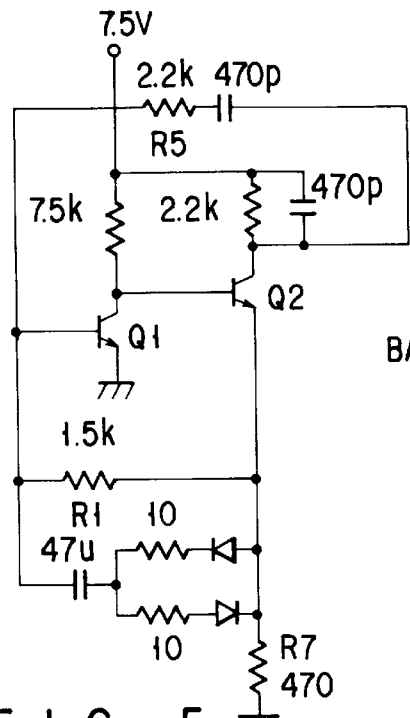
F I G. 5
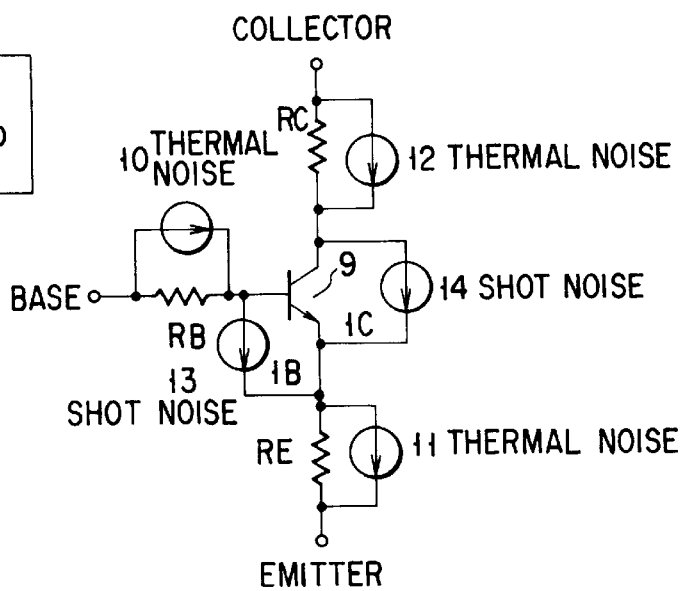
F I G. 6
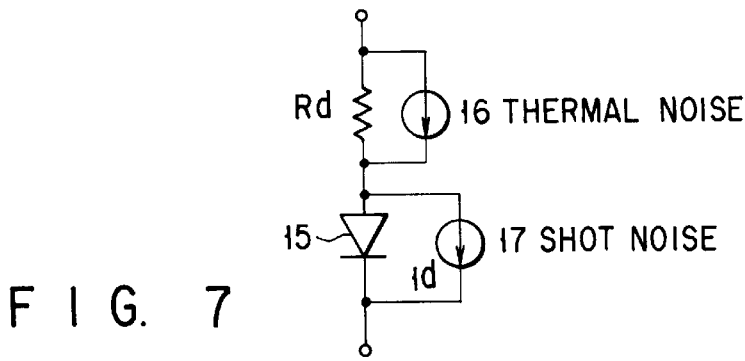
F I G. 7
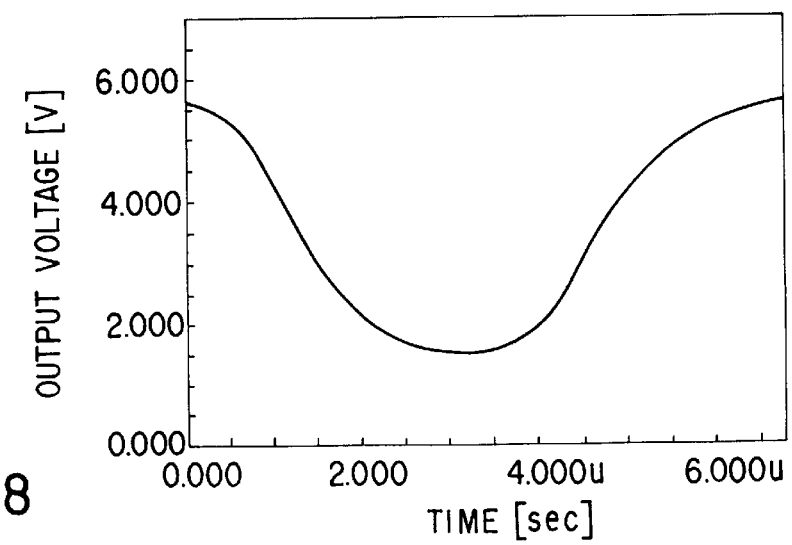
F I G. 8

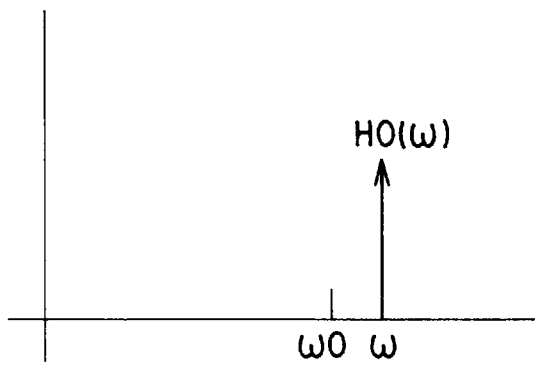
F I G. 13
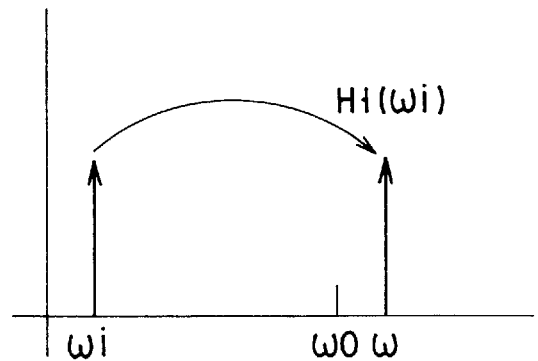
F I G. 14
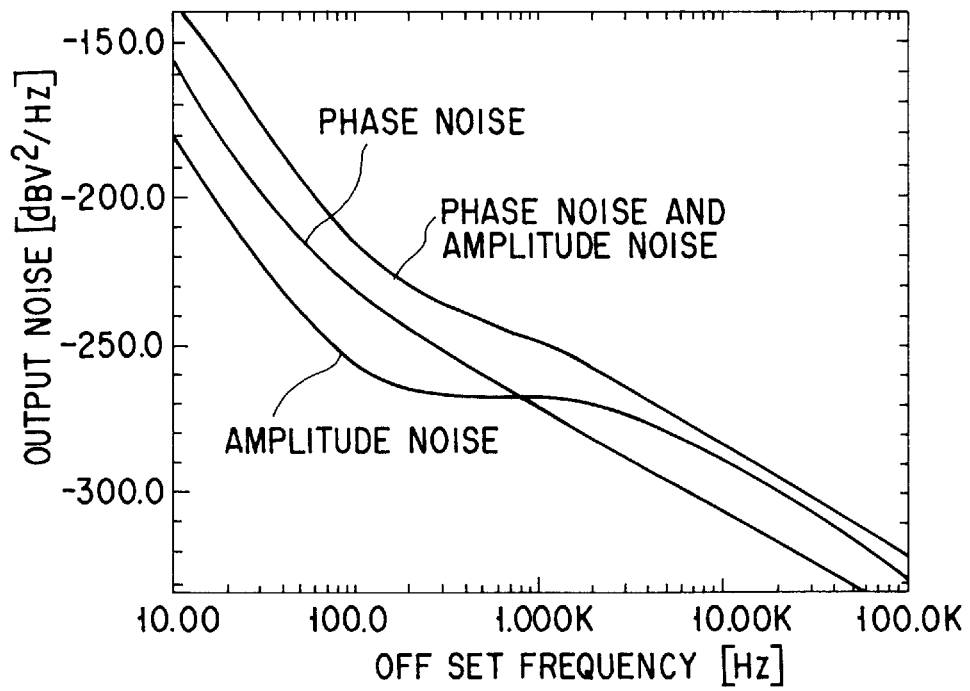
F I G. 15

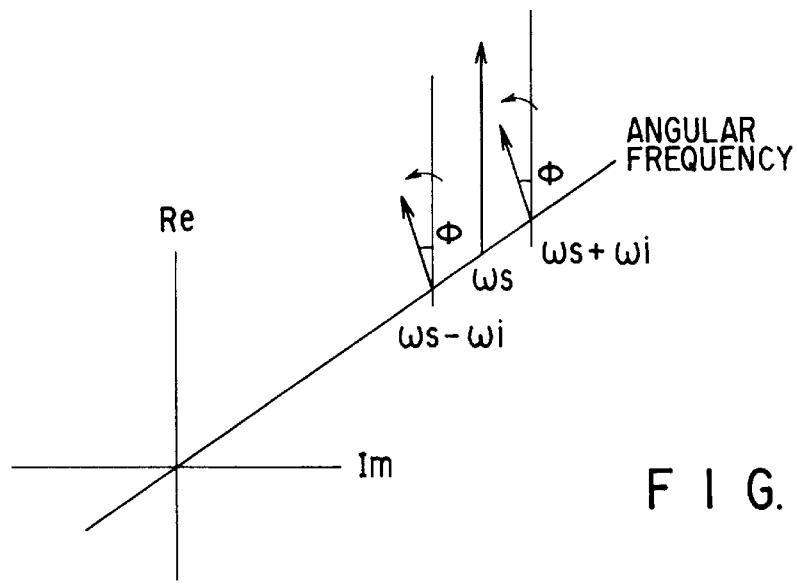
F I G. 16
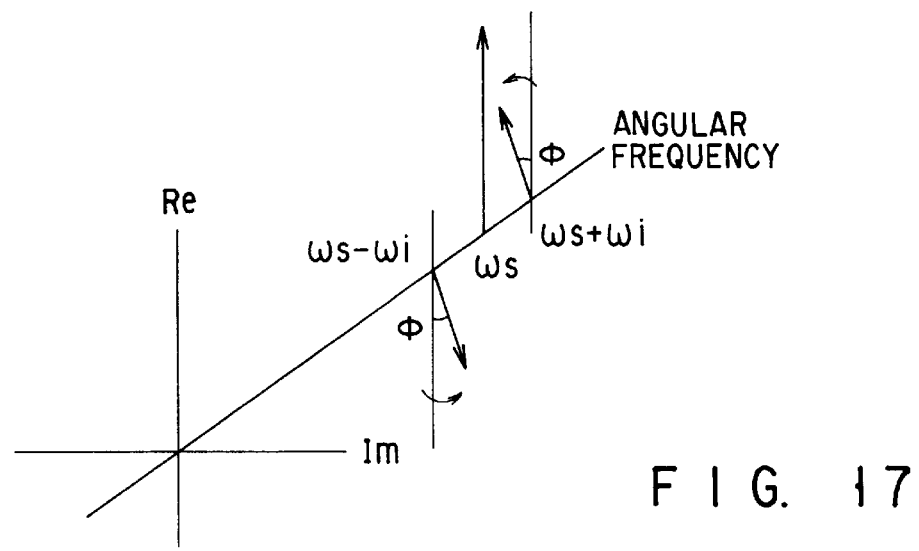
F I G. 17
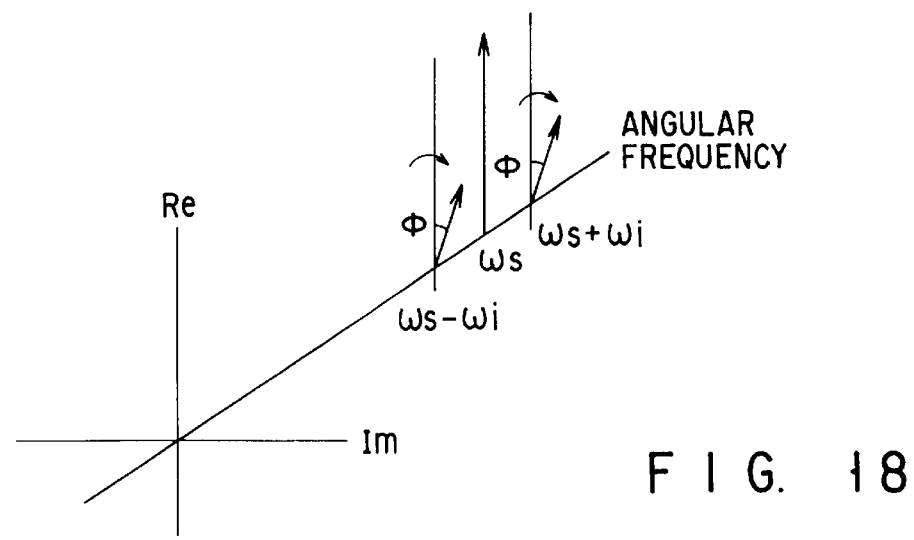
F I G. 18

NOISE ANALYZING APPARATUS FOR ANALYZING NOISE OF AUTONOMOUS SYSTEM BY SIMULATION

BACKGROUND OF THE INVENTION

The present invention relates to a noise analyzing apparatus for analyzing noise of an autonomous system consisting of electronic circuits such as an oscillator a multivibrator, etc.

As a method for analyzing noise of an electronic circuit, there is a method for adding a noise source to a linear equivalent circuit at a DC operating point and calculating a transfer function from the noise source to an output, thereby to calculate output noise. However, this method can not be applied for analyzing noise of such a system like an oscillator of which the operating point changes according to a lapse of time.

On the other hand, in the following literatures [1] and [2], there have been proposed methods for analyzing noise of such circuits like a mixer circuit and a switched capacitor circuit of which operating point changes periodically when a periodical excitation is added to these circuits.

Literature [1]: Makiko Okumura, Hiroshi Tanimoto and Tsutomu Sugawara, "Noise analysis by computer for non-linear circuits having two input signals", the Institute of Electronics, Information and Communication Engineers, Papers A, Vol. J73-A No. 8, pp. 1342–1349, 1990.

Literature [2]: Makiko Okumura, Hiroshi Tanimoto, Tetsuro Itakura and Tsutomu Sugawara, "Numerical noise analysis for nonlinear circuits with a periodic large signal excitation including cyclostationary noise sources", IEEE Trans. Circuits Syst., I: Fundamental Theory and Applications, Vol. 40, No. 9, pp. 581–590, September, 1993.

However, none of the above-mentioned literatures describe a method for analyzing an autonomous system of which the operating point changes periodically. Accordingly, there has so far been no method for simulating noise of a general autonomous system prior to a trial manufacturing of the system, and there has been no way but making a rough estimate of noise from the past experience at the stage of designing.

Further, the following literature [3] discloses an apparatus for calculating noise of an oscillator.

Literature [3]: Andy Howard, "Simulate oscillator phase noise", Microwaves & RF, pp. 64–70, November, 1993.

However, according the method in the literature [3], it is possible to calculate only noise of an oscillator including a resonator and it is not possible to calculate noise and output a result of analysis by splitting the output power into amplitude noise and phase noise.

With a view to eliminating the above-described problems, it is an object of the present invention to provide a noise analyzing apparatus which can analyze noise of an autonomous system by simulation prior to the manufacturing of the system, without actually involving a trial manufacturing of the system.

Further, it is another object of the present invention to provide a noise analyzing apparatus which can calculate noise by splitting output power into phase noise and amplitude noise and output each noise for improved precision of the output of each noise.

BRIEF SUMMARY OF THE INVENTION

In order to achieve the above-described objects, according to a first aspect of the present invention, a noise analyzing apparatus of the present invention consists of an input unit for inputting information including a structure of an autonomous system, parameter values and analysis conditions, a periodic steady-state solution calculating unit for calculating a periodic steady-state solution of the autonomous system by using the information inputted from this input unit, a noise source adding unit for adding a noise source to a periodic linear time-variant system obtained by linearizing the autonomous system around the periodic steady-state solution calculated by the periodic steady-state solution calculating unit, a time-variant transfer function calculating unit for calculating, for each noise source, a time-variant transfer function of the periodic linear time-variant system to which noise sources are added by the noise source adding unit, a reflected component calculating unit for adding power of a time-variant transfer function reflected to a frequency to be observed out of the time-variant transfer functions calculated by the time-variant transfer function calculating unit, and an output unit for selectively outputting results of calculations by the periodic steady-state solution calculating unit, the time-variant transfer function calculating unit and the reflected component calculating unit, as a result of analysis of noise.

Further, according to a second aspect of the present invention, a noise analyzing apparatus of the present invention consists of an input unit for inputting information including a structure of an autonomous system, parameter values and analysis conditions, a periodic steady-state solution calculating unit for calculating a periodic steady-state solution of the autonomous system by using the information inputted from this input unit, a noise source adding unit for adding a noise source to a periodic linear time-variant system obtained by linearizing the autonomous system around the periodic steady-state solution calculated by the periodic steady-state solution calculating unit, a time-variant transfer function calculating unit for calculating, for each noise source, a time-variant transfer function of the periodic linear time-variant system to which noise sources are added by the noise source adding unit, a phase and amplitude noise calculating unit for calculating respectively phase noise and amplitude noise of a time-variant transfer function calculated by the time-variant transfer function calculating unit, and an output unit for selectively outputting results of calculations by the periodic steady-state solution calculating unit, the time-variant transfer function calculating unit and the phase and amplitude noise calculating unit, as a result of analysis of noise.

Further, according to a third aspect of the present invention, a noise analyzing apparatus of the present invention consists of an input unit for inputting information including a structure of an autonomous system, parameter values and analysis conditions, a periodic steady-state solution calculating unit for calculating a periodic steady-state solution of the autonomous system by using the information inputted from this input unit, a noise source adding unit for adding a noise source to a periodic linear time-variant system obtained by linearizing the autonomous system around the periodic steady-state solution calculated by the periodic steady-state solution calculating unit, a time-variant transfer function calculating unit for calculating respectively a first noise component which is outputted after having been converted into a focused frequency from another frequency and a second noise component which is outputted without being frequency converted and for calculating, for each noise source, a time-variant transfer function of the periodic linear time-variant system to which noise sources are added by the noise source adding unit, a phase noise calculating unit for calculating, for each noise source, power of a portion which contributes to phase noise of a time-variant transfer function relating to the first and second noises calculated by the time-variant transfer function calculating unit, and an output unit for selectively outputting results of calculations by the periodic steady-state solution calculating unit, the time-variant transfer function calculating unit and the phase noise calculating unit, as a result of analysis of noise.

Further, according to a fourth aspect of the present invention, a noise analyzing apparatus of the present invention consists of an input unit for inputting information including a structure of an autonomous system, parameter values and analysis conditions, a periodic steady-state solution calculating unit for calculating a periodic steady-state solution of the autonomous system by using the information inputted from this input unit, a noise source adding unit for adding a noise source to a periodic linear time-variant system obtained by linearizing the autonomous system around the periodic steady-state solution calculated by the periodic steady-state solution calculating unit, a time-variant transfer function calculating unit for calculating respectively a first noise component which is outputted after having been converted into a focused frequency from another frequency and a second noise component which is outputted without being frequency converted and for calculating, for each noise source, a time-variant transfer function of the periodic linear time-variant system to which noise sources are added by the noise source adding unit, an amplitude noise calculating unit for adding, for each noise source, power of a portion which contributes to amplitude noise of a time-variant transfer function relating to the first and second noises calculated by the time-variant transfer function calculating unit, and an output unit for selectively outputting results of calculations by the periodic steady-state solution calculating unit, the time-variant transfer function calculating unit and the amplitude noise calculating unit, as a result of analysis of noise.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 is a diagram for showing a structure of an oscillating circuit as an example of the circuit of an autonomous system;

FIG. 6 is a diagram for showing a structure of a transistor included in an oscillating circuit to which a noise source is added;

FIG. 7 is a diagram for showing a structure of a diode included in an oscillating circuit to which a noise source is added;

FIG. 8 is a diagram for showing a periodic steady-state solution of the example circuit;

FIG. 13 is a diagram for showing a transfer function which is not frequency converted;

FIG. 14 is a diagram for showing a transfer function which is frequency converted;

FIG. 15 is a diagram for showing outputs of phase noise, amplitude noise and a total of both noises;

FIG. 16 is a vector diagram of a real part of a time-variant transfer function $H_1(\omega_i)$;

FIG. 17 is a vector diagram of an imaginary part of the time-variant transfer function $H_1(\omega_i)$;

FIG. 18 is a vector diagram of a real part of a time-variant transfer function $H_1(-\omega_i)$;

DETAILED DESCRIPTION OF THE INVENTION

Embodiments of the present invention will be explained in detail below with reference to the drawings.

Figure 1:
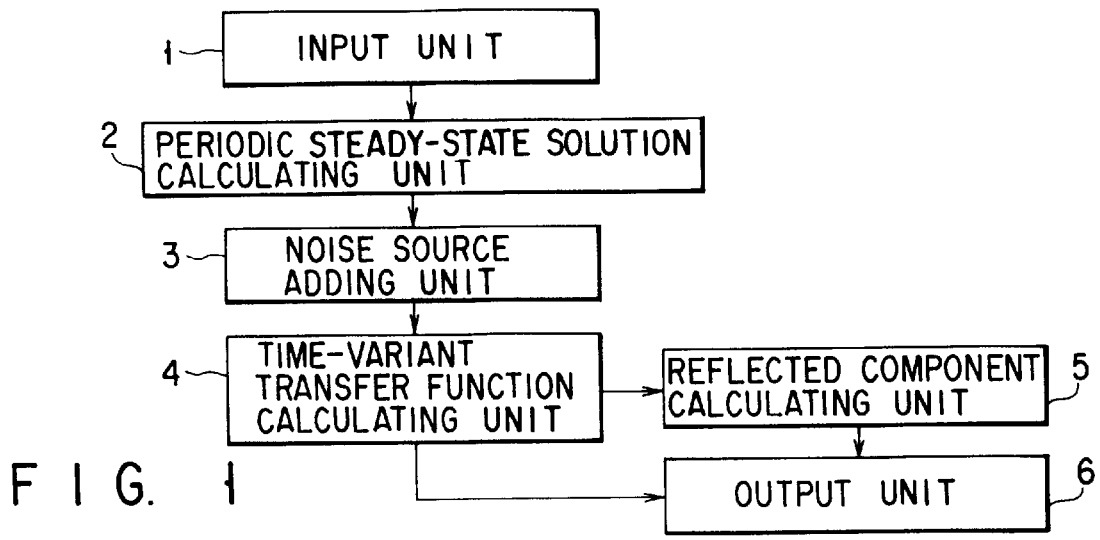
FIG. 1 is a block diagram for showing a structure of a noise analyzing apparatus of an autonomous system relating to a first embodiment of the present invention.

FIG. 1 is a block diagram for showing a structure of a noise analyzing apparatus of an autonomous system relating to a first embodiment of the present invention. In this case, the autonomous system refers to a system which generates a self-excitation in its steady state without an application of external periodic force.

As shown in FIG. 1, the noise analyzing apparatus relating to the present embodiment is structured by an input unit 1, a periodic steady-state solution calculating unit 2, a noise source adding unit 3, a time-variant transfer function calculating unit 4, a reflected component calculating unit 5 and an output unit 6.

The input unit 1 is an input unit for specifying analyzing conditions such as a structure of an autonomous system, parameter values, frequency to be observed, a noise source band, etc. and an output method. For assigning an output frequency, it is possible to specify the frequency by specifying a magnitude of an increase or a decrease on the basis of an oscillation frequency, for example.

The periodic steady-state solution calculating unit 2 is a unit for calculating a periodic steady-state solution of an oscillation frequency and an oscillation amplitude of the autonomous system. As calculation methods, there are a method for numerically integrating a differential equation and a method as shown in the following literature [4].

Literature [4]: K. S. Kundert, J. K. White, and A. Sangiovanni-Vincentelli, Steady-State Methods for Simulating Analog and Microwave Circuits, Kluwer Academic Publishers, U.S.A., 1990.

When an autonomous system is expressed by the following expression (1) and a steady-state solution is expressed as $V_{ss}$, an expression (2) is obtained since the steady-state solution is periodic.

$$f(v(t),\dot{v}(t))=0 \qquad (1)$$

$$v_{ss}(t)=v_{ss}(t+T) \qquad (2)$$

where, $$T = \frac{1}{f_0}, (f_0: \text{oscillation frequency})$$

The noise source adding unit 3 is a unit for adding a noise source to a periodic linear time-variant system. Noise is usually a small signal of which amplitude is smaller than that of an autonomous system, and therefore the relationship between the noise and its output can be regarded as linear. Accordingly, it is possible to analyze noise by using a linear equivalent circuit which is linearized around a periodic steady-state solution of the autonomous system.

A linear equivalent circuit which is linearized around a periodic steady-state solution of the autonomous system that has been calculated by the periodic steady-state solution calculating unit 2 becomes a periodic linear time-variant system of which parameters change periodically, and this can be expressed by the following expression (3).

$$g(t)\dot{x}(t)+c(t)x(t)=0 \qquad (3)$$

where, $$g(t) = \left. \frac{\partial f(t)}{\partial v(t)} \right|_{v(t)=v_{ss}(t)}$$

$$c(t) = \left. \frac{\partial f(t)}{\partial \dot{v}(t)} \right|_{\dot{v}(t)=\dot{v}_{ss}(t)}$$

δv(t)=x(t)
δv̇(t)=ẋ(t)
g(t)=g(t+T)
c(t)=c(t+T)

When a spectrum representing a position of a k-th noise source is expressed as $Z_k$, the expression of the periodic linear time-variant system to which this noise source has been added is given by the following expression (4).

$$g(t)\dot{x}(t)+c(t)x(t)=z_k \qquad (4)$$

Figure 2:
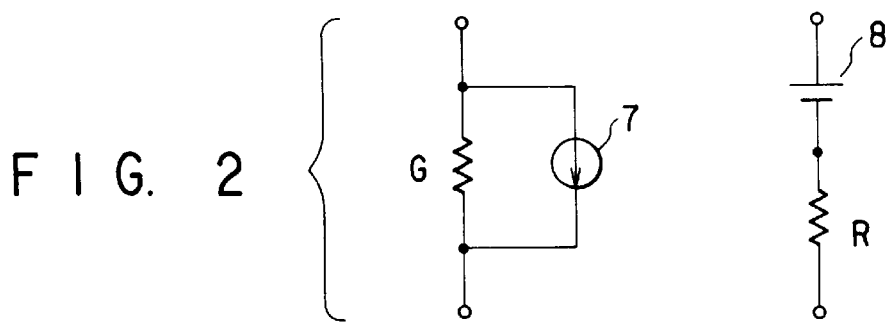
FIG. 2 is a diagram for showing a thermal noise source of a resistor.

FIG. 2 is a circuit diagram of the case where a noise source representating thermal noise of a resistor is added to the resistor. In the drawing, 7 represents a case where a noise source is added as a current source and 8 represents a case where a noise source is added as a voltage source.

Referring to FIG. 1, the time-variant transfer function calculating unit 4 is a unit for calculating a transfer function from a noise source of the periodic linear time-variant system to which the noise source is added to its output. Methods for calculating a transfer function are described in the following literature [5], literature [6] and literature [7], for example.

Literature [5]: Makiko Okumura, Tsutomu Sugawara and Hiroshi Tanimoto, "An Efficient Small Signal Analysis Method of Nonlinear Circuits with Two Frequency Excitations", IEEE Trans. Comput.-Aided Des. Integrated Circuits Syst., Vol. 9, No. 3, pp. 225–235, March, 1990.

Literature [6]: Makiko Okumura, Hiroshi Tanimoto, Tetsuro Itakura and Tsutomu Sugawara, "Numerical noise analysis for nonlinear circuits with a periodic large signal excitation including cyclostationary noise source", IEEE Trans. Circuits Syst., I: Fundamental Theory and Applications, Vol. 40, No. 9, pp. 581–590, September, 1993.

Literature [7]: Stephen A. Mass, Nonlinear Microwave Circuits, Artech House Boston, London, 1988.

According to these methods, transfer functions which appear as an output in the frequency same as the input frequency and transfer functions of other higher harmonic components are calculated by using time-variant parameters of a periodically changing circuit.

Figure 3:
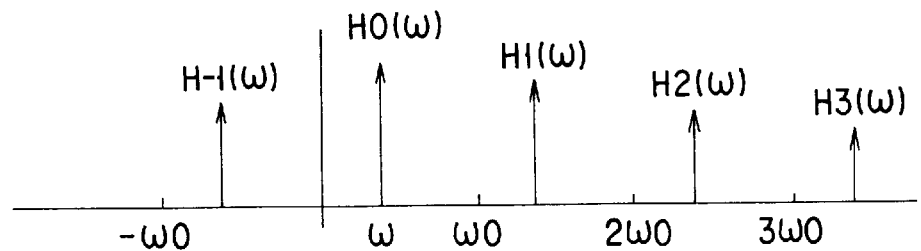
FIG. 3 is a diagram for showing a spectrum of a time-variant transfer function which appears in the output when an input frequency is $\omega$.

FIG. 3 shows a spectrum of a time-variant transfer function appearing in the output when the input frequency is ω, where $\omega_0=2\pi f_0$.

Figure 4:
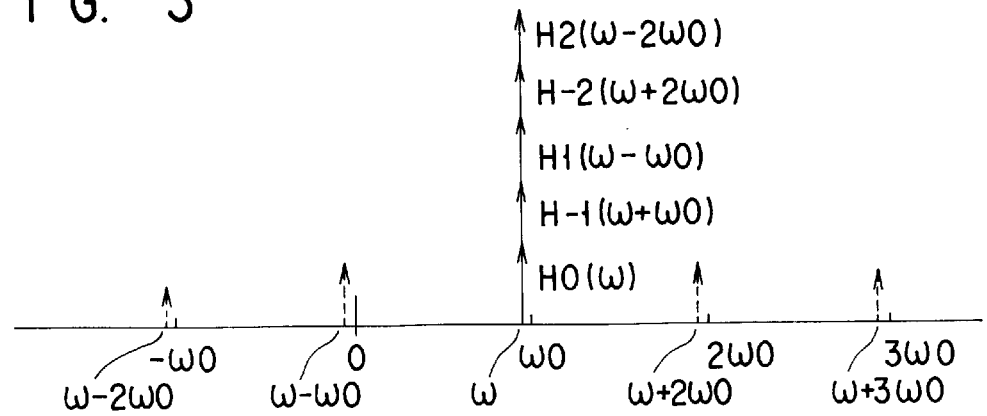
FIG. 4 is a diagram for showing a spectrum of a transfer function reflected to the frequency $\omega$.

FIG. 4 shows a spectrum of a transfer function reflecting to the frequency ω. As shown in the drawing, when a noise source has a certain band, the components of - - - , $H_1$ (ω−ω₀), $H_0$ (ω), $H_{-1}$ (ω+ω₀), $H_{-2}$ (ω+2ω₀), - - - are reflected to the output noise components of the frequency ω. The time-variant transfer function calculating unit 4 calculates these transfer functions for each noise source. To which level of the higher harmonic components of the time-variant transfer functions the calculating unit 4 should calculate or how to take the band of the noise source is specified by the user. Alternately, predetermined values are used for these purposes.

Next, the reflected component calculating unit 5 is a unit for adding power of a time-variant transfer function to be reflected to the frequency to be observed, for the time-variant transfer function calculated for each noise source by the time-variant transfer function calculating unit 4.

$$S(\omega) = \sum_{l=L}^{L} |H_l(\omega - l\omega_0)|^2 s(\omega - l\omega_0) \qquad (5)$$

In this case, S (ω) represent a power spectrum density of a noise output, $H_1$ (ω−1ω₀) represents a transfer function, s (ω−1ω₀) represents a power spectrum of a noise source, ω represents a focussed frequency, $\omega_0=2\pi f_0$ represents an oscillation frequency and L represents a constant to be freely set by the user.

Next, the output unit 6 is a unit for outputting noise of each noise source and total noises of total noise sources for each degree, and noise of each noise source and total noises of total noise sources for the total degrees, and this output unit 6 includes a displaying unit for displaying a result of analysis as described below. Noise around the oscillation frequency is an important item included in the design specification.

FIG. 5 is a diagram for showing the structure of a Wien Bridge Oscillator as an example circuit of the autonomous system. FIG. 6 shows an example of the case where noise sources are added to a transistor 9 included in the oscillator. In this case, as the noise sources of the transistor 9, a thermal noise 10 of base resistance, a thermal noise 11 of emitter resistance, a thermal noise 12 of collector resistance, a shot noise 13 of a base current IB and a shot noise 14 of a collector current IC are considered.

FIG. 7 shows an example of the case where noise sources are added to a diode included in the oscillator. In this case, as noise sources of the diode 15, a thermal noise 16 of resistance Rd and a shot noise 17 of a current Id are considered.

Figure 9:
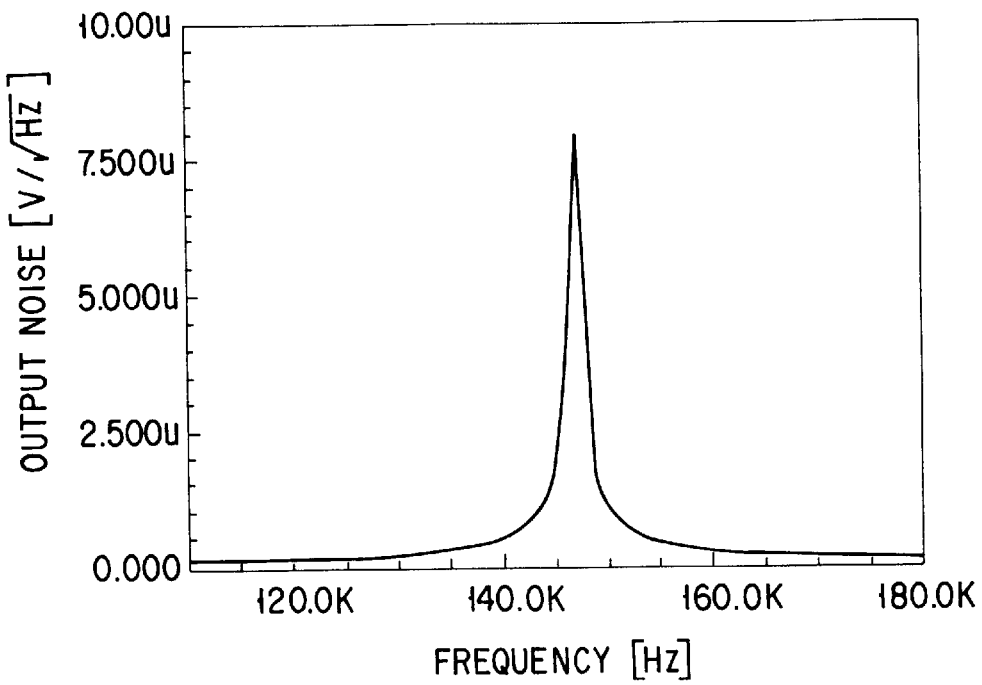
FIG. 9 is a diagram for showing total output noise calculated in the present embodiment.
Figure 10:
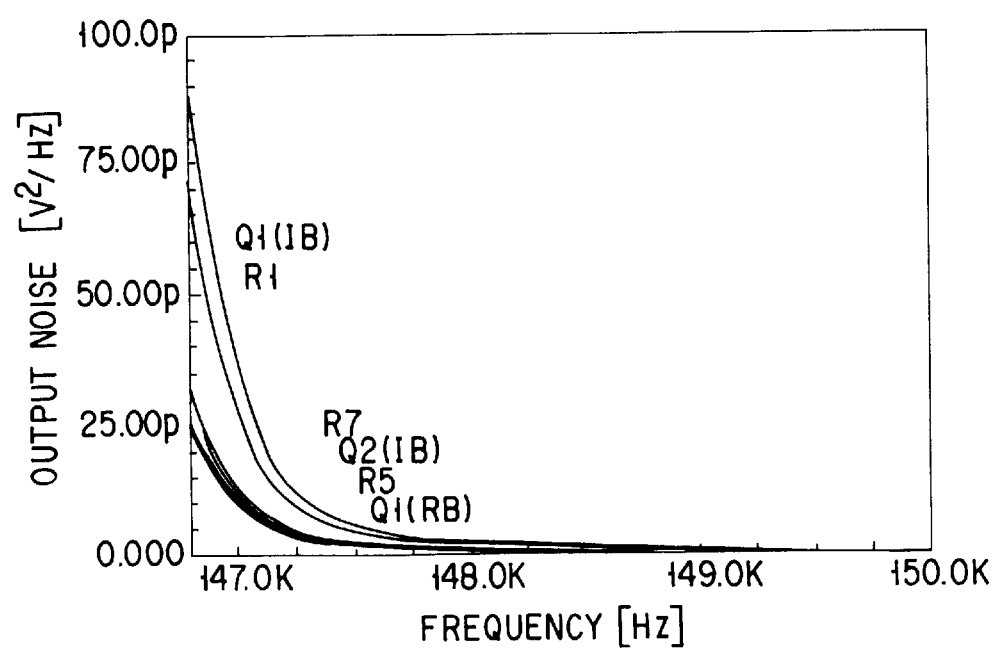
FIG. 10 is a diagram for showing an output result in which large noise in each noise source is displayed.

Results of the analysis of the oscillator having the above-described structures carried out by the present embodiment are shown in FIGS. 8 to 10.

FIG. 8 shows a periodic steady-state solution calculated by the periodic steady-state solution calculating unit 2. The oscillation frequency became 146.8 [kHz]. FIG. 9 is a diagram for showing a total output noise calculated in the present embodiment. In this case, reflected components are taken into account up to the 8-th degree.

FIG. 10 shows an output result for displaying larger noises among various noise sources. According to this example circuit, it is known that the shot noise of the base current of the transistor Q1 and the thermal noise of the resistor R1 shown in FIG. 5 give a large effect.

Figure 11:
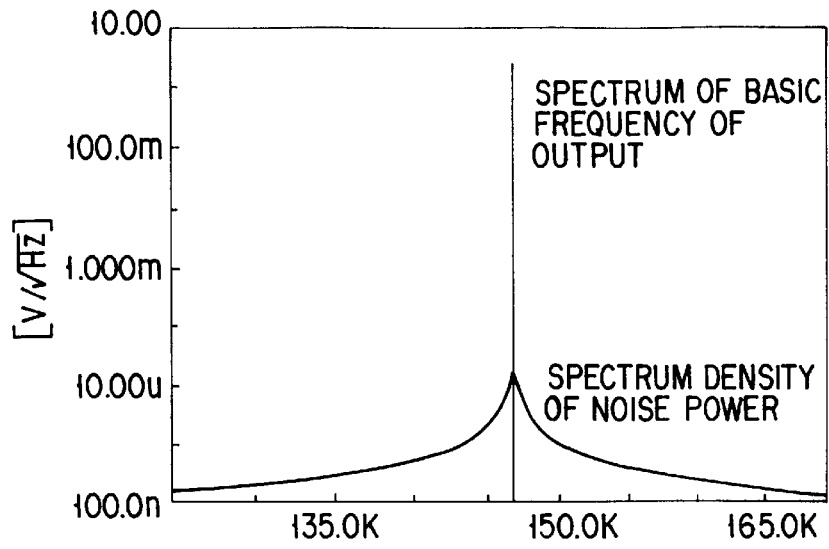
FIG. 11 is a diagram for showing a spectrum of the basic wave of an oscillator and a spectrum density of noise power superposed with each other.

FIG. 11 shows a spectrum of the basic wave (oscillation frequency) of the periodic steady-state solution calculated by the periodic steady-state solution calculating unit 2 and a noise power spectrum density calculated by the time-variant transfer function calculating unit 4 and the reflected component calculating unit 5, superposed with each other. The evaluation of the level of the noise restricted for the spectrum of the basic wave within a predetermined frequency band range is an essential item for a system design. Accordingly, making an analysis of the result as shown in FIG. 11 is very useful.

According to the above-described first embodiment of the present invention, it is possible to analyze in advance the noise of the autonomous system by simulation, without actually involving a trial manufacturing of the system.

Further, when a system of a trial manufacturing is measured as has been the case in the past, only the total noise can be measured from the total noise source. However, when a simulation according to the present embodiment is carried out, it is possible to analyze separately noise of each noise source and noise for each degree of a transfer function, and output separately the results of the respective analyses, so that it becomes possible to provide a feedback to the design for re-designing the system after taking into account the results of the analyses.

Next, description will be made of a second embodiment of the present invention in which output power is split into phase noise and amplitude noise for calculating the respective noises and outputting the results of the respective analyses.

Figure 12:
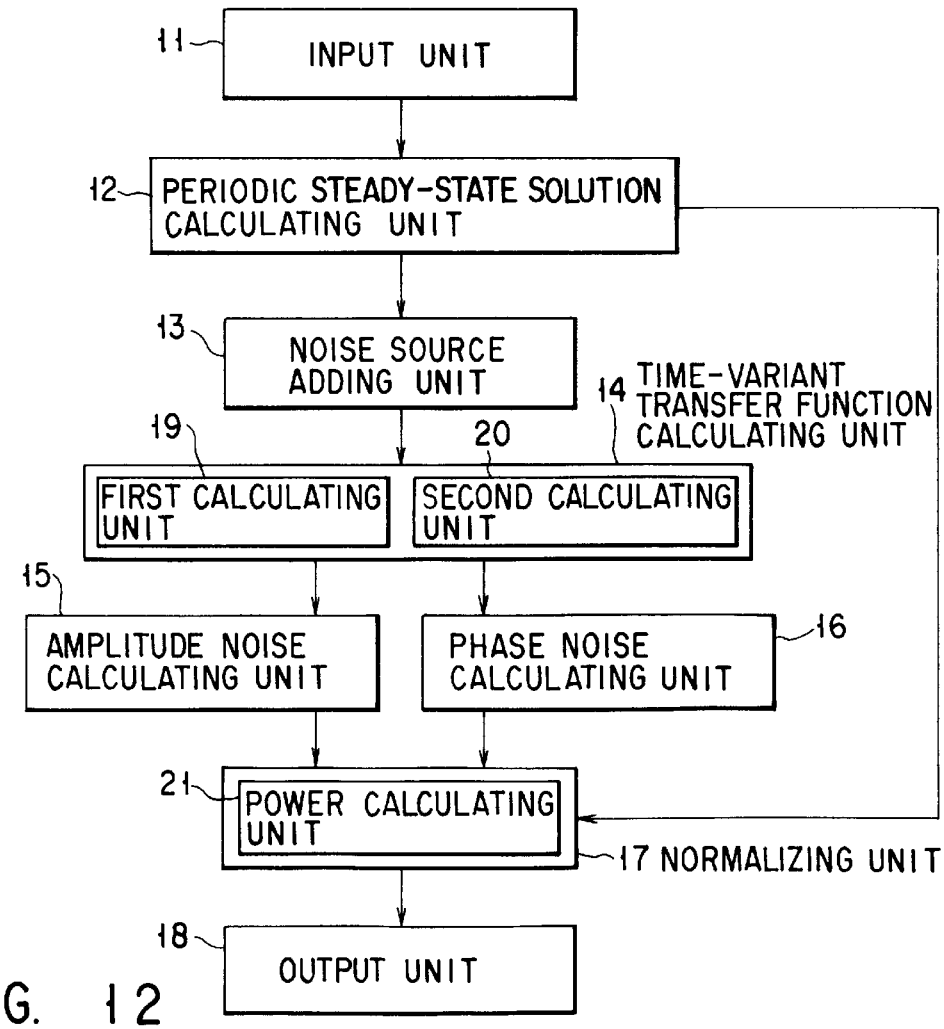
FIG. 12 is a block diagram for showing a structure of a noise analyzing apparatus of an autonomous system relating to a second embodiment of the present invention.

FIG. 12 is a block diagram for showing a structure of a noise analyzing apparatus of an autonomous system relating to the second embodiment of the present invention. As shown in the drawing, the noise analyzing apparatus is structured by an input unit 11, a periodic steady-state solution calculating unit 12, a noise source adding unit 13, a time-variant transfer function calculating unit 14, a phase noise calculating unit 15, an amplitude noise calculating unit 16, a normalizing unit 17 and an output unit 18.

The input unit 11 is a unit for specifying information relating to an autonomous system such as a structure of the system, element values, values of model parameters, an initial value of an oscillation frequency, etc., analyzing conditions such as an output frequency and a band of a noise source, a kind of noise (phase noise, amplitude noise, total of these noises, etc.) and a method of outputting a noise source.

The band of a noise source is specified by frequency or by an integer relating to the degree of a transfer function. In this case, the term, degree refers to a value of 1 when a periodic time-variant transfer function H (jω, t) is Fourier series expanded at time t, as shown below.

$$H(j\omega, t) = \sum_{l=-\infty}^{\infty} h_l(j\omega)e^{jl\omega_0 t} \quad (1)'$$

In this case, $\omega_0$ represents an oscillation frequency. For the output frequency, a detuning frequency from an oscillation frequency can be specified in addition to an absolute value of the frequency. At an input stage before carrying out a steady-state analysis, a correct oscillation frequency is not yet known. However, it is possible to specify a detuning frequency for the oscillation frequency of the result of the steady-state analysis. The detuning frequency is a value for showing how far a frequency is deviated from the oscillation frequency. In this case, for the detuning frequency, a point number in logarithmic scale, or a point number in linear scale, or a point number per one octave, or a point number per one decade can be specified.

The periodic steady-state solution unit 12 is a unit for calculating a self-excitation when the autonomous system has reached a steady-state status. For example, a self-excitation can be calculated by using a shooting method of a time domain or a harmonic balancing method of a frequency domain which are shown in the literature [4], as described in the first embodiment. The periodic steady-state solution can also be calculated by a method for carrying out a transient analysis and numerical integration until the oscillation reaches a steady-state status. In the case of obtaining a steady-state solution of the oscillator by using the shooting method or the harmonic balancing method, it is possible to finally calculate a steady-state solution including an oscillation frequency when an initial value of the oscillation frequency is given, even if a correct frequency is not known in advance.

The noise source adding unit 13 is a unit for adding noise sources to a self-exiting system. In the case of a thermal noise of resistance, for example, a current source is connected in parallel with the resistance, as shown in FIG. 2 in the first embodiment. The current value of the power source is determined by a power spectrum density held by the noise source.

The time-variant transfer function calculating unit 14 is a unit for calculating a transfer function from a noise source to an output. Since noise is small and noise and its output are considered to have a linear relation, an autonomous system can be regarded as a periodic time-variant circuit which is linearized around the periodic steady-state solution with respect to the noise. The time-variant transfer function calculating unit 14 is a unit for calculating transfer functions from the noise source of the periodic time-variant circuit to the output. In this case, the transfer function is an output when the amplitude of the input is 1. When the amplitude of the input is α, the output becomes α times of the transfer function. There are a method for multiplying the transfer function by b when the amplitude of a current source added to the noise source as an input is b, and a method for calculating an output to the input of which amplitude is b. The time-variant transfer function calculating unit 14 may also obtain a value of the b times of the transfer function from the beginning, as in the latter case.

In the following explanation, a periodic time-variant transfer function or a transfer function will mean the right-hand side Fourier components $H_1$ (j$\omega$), 1= - - - , −1, 0, 1, 2, - - - in the expression (1)'.

The time-variant transfer function calculating unit 14 can calculate a transfer function by using the method of time domain (the literatures [4] and [5] shown in the first embodiment) and the method of frequency domain using the harmonic balancing method (the literature [7]).

More specifically, the time-variant transfer function calculating unit 14 is a unit for calculating transfer functions (output) of the respective components reflected to a certain output frequency, and the time-variant transfer function calculating unit 14 consists of a first calculating unit 19 for calculating the components outputted at the frequency which is the same as the frequency of the noise and a second calculating unit 20 for calculating the components that have been frequency converted to a focussed output frequency from other frequency.

FIG. 13 shows a transfer function of a component outputted to the output frequency $\omega$, without being frequency converted, and FIG. 14 shows a transfer function outputted to the output frequency $\omega_i+\omega_0$ (=$\omega$) after being frequency converted when the frequency component held by the noise is $\omega_i$. It should be noted that, in the first embodiment, the first calculating unit 19 and the second calculating unit 20 are explained as one unit because it is not necessary to discriminate both units.

The amplitude noise calculating unit 15 is a unit for calculating power contributing to the amplitude noise for showing how much the oscillation amplitude has changed when noise was applied. The phase noise calculating unit 16 is a unit for calculating power contributing to the phase noise for showing how much the oscillation frequency has changed when noise was applied. In this case, for the component which has not been frequency converted that is calculated by the first calculating unit 19, noise is originally a random signal. Since there is no meaning in the phase of the random signal itself, the power contributing to the phase/amplitude noise is ½ respectively. Of the frequency converted component that is calculated by the second calculating unit 20, the power of the amplitude modulated component is amplitude noise and the power of the frequency modulated component is phase noise. The amplitude modulated component is determined by the real part of the frequency converted component, and the frequency modulated component is determined by the imaginary part of the frequency converted component.

The reason for the above will be explained as follows. Consider a time-variant transfer function $H_1$ ($\omega_i$) of which input frequency is $\omega_i$ and output frequency is $\omega_i+\omega_0$. This will be expressed by separating amplitude and phase as follows.

$$H_1(\omega_i)=|H_1(\omega_i)|e^{j\angle H^1(\omega^i)}$$

when the output is expressed as x (t), $$x(t)=H_1(J\omega_i)e^{j(\omega^i+\omega^0)t} \qquad (2)'$$

Therefore, $$x(t)=|H_1(\omega_i)|e^{j\angle H^1(\omega^i)}e^{j(\omega^i+\omega^0)t}$$

$|H_1(\omega_i)|$ shows the amplitude change of the output, and $e^{j\angle H^1(\omega^i)}$ shows how far the phase of the output signal rotating at the frequency $\omega_i$ or the signal rotating at $\omega_i+\omega_0$ is deviated from the carrier signal operating at the oscillation frequency $\omega_0$, viewed from the carrier signal.

Assuming that the output of an angular frequency $\omega_0+\omega_i$ of noise viewed from the carrier signal operating at the oscillation frequency $\omega_0$ is expressed as $x_i$ (t)', $$x_i(t)'=H_1(\omega_i)e^{j\omega^i_i t} \qquad (3)'$$

The expression (3)' is a complex number and this can be split into a real part and an imaginary part. Further, the real part and the imaginary part can be considered as an output of the cos input and an output of the sin input respectively from the Euler's formula, $e^{jwit}$=cos $\omega_i$t+j sin $\omega_i$ t.

$$x_i(t)=|H_1(\omega_i)|e^{j\phi}\cos(\omega_1 t)+j|H_1(\omega_i)|e^{j\phi}\sin(\omega_i t) \qquad (4)'$$

where, $\phi=\angle H_1(\omega_1)$. The expression (4)' can be Fourier transformed as follows.

$$F\{x_i'(t)\}=|H_1(\omega_i)|e^{j\phi}\pi\{\delta(\omega_i)+\delta(\omega+\omega_i)+\delta(\omega-\omega_i)-\delta(\omega+\omega_i)\} \qquad (5)'$$

The first and second terms of the expression (5)' are Fourier transforms of the real part of the time-variant variant transfer function, and the third and fourth terms are Fourier transforms of the imaginary part. FIGS. 16 and 17 show spectrum diagrams of the real part and the imaginary part of the time-variant transfer function $H_1$ ($\omega_i$) respectively.

Similarly, when the output of the angular frequency −$\omega_i$ observed from the carrier operating at the oscillation frequency $\omega_0$ is expressed as $x'_{-i}$ (t), $$x'_{-i}(t)=H_1(-\omega_i)\cos(-\omega_i t)+jH_1(-\omega_i)\sin(-\omega_i t) \qquad (6)'$$

The expression (6)' is Fourier transformed as follows.

$$F\{x_{-i}'(t)\}=|H_1(-\omega_i)|e^{j\phi}\pi\{\delta(\omega+\omega_i)+\delta(\omega-\omega_i)+\delta(\omega+\omega_i)-\delta(\omega-\omega_i)\} \quad (7)'$$

Figure 19:
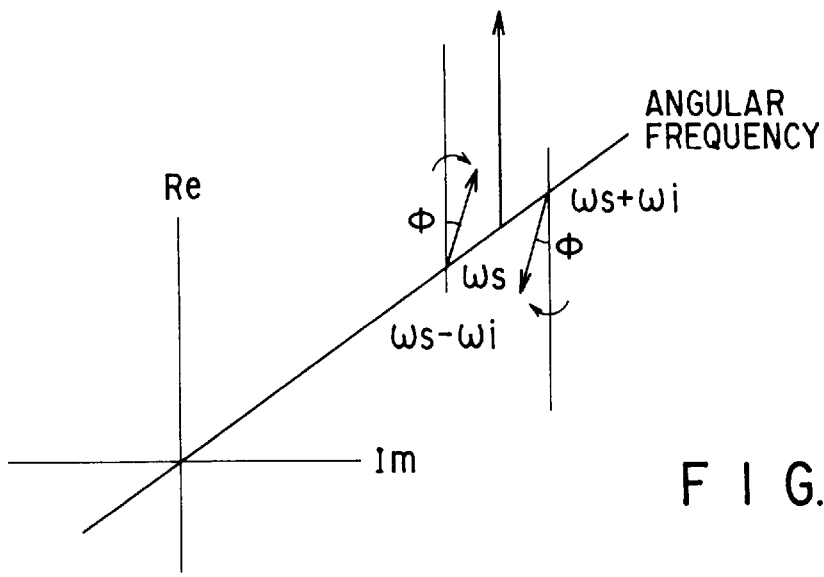
FIG. 19 is a vector diagram of an imaginary part of a time-variant transfer function $H_1(-\omega_i)$.

In this case, $H_1$ ($\omega_i$) and $H_1$ (−$\omega_i$) are in a mutually complex conjugate relationship, and accordingly, taking this into consideration, FIGS. 18 and 19 of the expression (7)' show the real part and the imaginary part of $H_1$ (−$\omega_i$) in vector.

Figure 20:
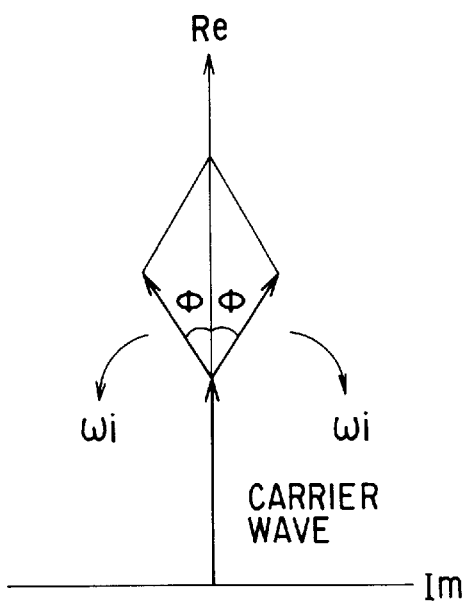
FIG. 20 is a vector diagram of a real part of the time-variant transfer functions $H_1(\omega_i)$ and $H_1(-\omega_i)$.
Figure 21:
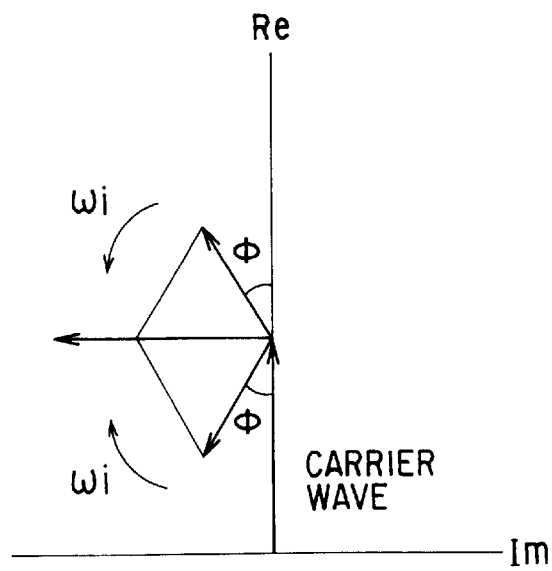
FIG. 21 is a vector diagram of an imaginary part of the time-variant transfer functions $H_1(\omega_i)$ and $H_1(-\omega_i)$.

Since $H_1$ ($\omega_i$) and $H_1$ (−$\omega_i$) are mutually correlated, FIG. 16 and FIG. 18 which are the respective real parts can be expressed in vector on the same complex plane as shown in FIG. 20, and FIG. 17 and FIG. 19 which are the respective imaginary parts can be expressed in vector on the same complex plane as shown in FIG. 21. From these diagrams, it is obvious that the real part of the frequency converted component is in same phase with the carrier and this expresses the amplitude modulation component and that the imaginary part is orthogonal with the carrier and this expresses the frequency modulation component. As a result, the real part and the imaginary part of the time-variant transfer function (output) show the phase noise and the amplitude noise of the frequency converted noise output respectively.

Accordingly, the amplitude noise calculating unit 15 for calculating the power contributing to the amplitude noise adds the ½ of the power of the component not frequency converted, calculated by the first calculating unit 19 and the power of the real part of the frequency converted component, calculated by the second calculating unit 10, according to the following expression (8)'. Further, the phase noise calculating unit 16 for calculating the power contributing to the phase noise adds the ½ of the power of the component not frequency converted, calculated by the first calculating unit 19 and the power of the imaginary part of the frequency converted component, calculated by the second calculating unit 20, according to the following expression (9)'.

$$S_{mag}(\omega) = \frac{1}{2} |H_0(\omega)|^2 s(\omega) + \sum_{\substack{l \neq 0 \\ l=-L}}^{L} |\text{Re}\{H_l(\omega - l\omega_o)\}|^2 s(\omega - l\omega_0) \qquad (8)'$$

$$S_{phase}(\omega) = \frac{1}{2} |H_0(\omega)|^2 s(\omega) + \sum_{\substack{l \neq 0 \\ l=-L}}^{L} |\text{Im}\{H_l(\omega - l\omega_o)\}|^2 s(\omega - l\omega_0) \qquad (9)'$$

In this case, Im in the expression (8') represents the imaginary part and Re in the expression (9)' represents the real part.

Next, the normalizing unit 17 is a unit for calculating the normalized amplitude noise and the normalized phase noise defined as follows respectively.

$$N_{amp} = \frac{\text{amplitude noise power per 1 Hz at distance of } f \text{ [Hz] from the oscillation frequency}}{\text{oscillation power}}$$

$$N_{phs} = \frac{\text{frequency noise power per 1 Hz at a distance of } f \text{ [Hz] from the oscillation frequency}}{\text{oscillation power}}$$

In this case, $N_{amp}$ and $N_{phs}$ show the normalized amplitude noise and the normalized phase noise respectively. By the above definition, the normalizing unit 17 has a power calculating unit 21 for calculating the spectrum of the oscillation frequency and its power by using the result of the calculation by the periodic steady-state solution calculating unit 12. The normalizing unit 17 divides the results of the calculation by the amplitude noise calculating unit 15 and the phase noise calculating unit 16, by the result obtained by the calculation of the power calculating unit 21, for obtaining the $N_{amp}$ and $N_{phs}$.

When the unit is expressed as dBC/Hz, the above can be expressed as 10 log $\{N_{amp}\}$ and 10 log $\{N_{phs}\}$. Usually, the result measured by a phase noise measuring apparatus is the above-described normalized phase noise. A mere reference of phase noise means the above in most cases.

As methods for calculating a spectrum by the power calculating unit 21, there are Fast Fourier Transform (FFT), Discrete Fourier Transform (DFT) and Fourier numerical integration, for example. When the periodic steady-state solution has been obtained by the method of frequency domain like the harmonic balancing method, the spectrum of the oscillation frequency already calculated by the periodic steady-state solution calculating unit 12 is used directly.

The output unit 18 is a unit for outputting a result of the calculation in the format specified by the input unit 11. This outputs the phase noise or amplitude noise for each noise source or the total of both noises, and total phase noises or amplitude noise of the total noise sources or the total of both noises. The output unit 18 can also output for each degree of the transfer function, and can output phase noise or amplitude noise of the component frequency converted to the vicinity of the oscillation frequency from the base band component, or the total of both noises. The output for each degree of the transfer function can be further outputted for each noise source.

So far, there has not been an apparatus for outputting noise by splitting the noise into amplitude noise and phase noise. It is important for a designer to know whether the output noise of a certain noise source contributes to the phase or it contributes to the amplitude. FIG. 15 is a diagram for outputting phase noise, amplitude noise and the total of both. The abscissa shows the detuning frequency from the oscillation frequency. What is of interest to the designers is the frequency near the oscillation frequency. For this purpose, a logarithmic display of the detuning frequency has an advantage over a logarithmic display of the absolute values of the frequency because the points of frequency near the oscillation frequency can be taken sufficiently by the logarithmic display of the detuning frequency. The output unit 18 outputs a result for the detuning frequency based on the oscillation frequency of the result obtained by the calculation of the periodic steady-state solution calculating unit 12, on the basis of the items specified by the input unit 11.

According to the above-described second embodiment, it is possible to analyze noise of an autonomous system by simulation in advance, without actually involving a trial manufacturing of the system. Further, since amplitude noise and phase noise are calculated separately and the outputs are produced separately, the precision of the output of each noise is improved.

Further, by carrying out a simulation, it is possible to analyze noise for each noise source, noise for each degree of a transfer function, and amplitude noise and phase noise separately, and output these noises separately, although only total noises can be measured from total noise sources when a system of a trial manufacturing is measured. Accordingly, there is an effect that it is possible to feedback a result of the analysis to the designing of a system for enabling a re-designing by taking into account the result of analysis.

Additional advantages and modifications will readily occur to those skilled in the art. Therefore, the invention in its broader aspects is not limited to the specific details, and representative embodiments shown and described herein. Accordingly, various modifications may be made without departing from the spirit or scope of the general inventive concept as defined by the appended claims and their equivalents.

I claim:

1. A noise analyzing apparatus for an autonomous system, comprising:

input means for inputting information including a structure of an autonomous system, parameter values and analysis conditions;

periodic steady-state solution calculating means for calculating a periodic steady-state solution of said autonomous system by using said information inputted from said input means;

noise source adding means for adding a noise source to a periodic linear time-variant system obtained by linearizing said autonomous system around said periodic steady-state solution calculated by said periodic steady-state solution calculating means;

time-variant transfer function calculating means for calculating, for each noise source, a time-variant transfer function of said periodic linear time-variant system to which noise sources are added by said noise source adding means;

reflected component calculating means for adding power of a time-variant transfer function reflected to a frequency to be observed out of said time-variant transfer functions calculated by said time-variant transfer function calculating means; and output means for selectively outputting results of calculations by said periodic steady-state solution calculating means, said time-variant transfer function calculating means and said reflected component calculating means, as a result of analysis of noise.

2. A noise analyzing apparatus for an autonomous system according to claim 1, wherein said output means includes display means for displaying in combination a periodic steady-state solution calculated by said period steady-state solution calculating means and noise obtained by calculation of said time-variant transfer function calculating means and said reflected component calculating means.

3. A noise analyzing apparatus for an autonomous system, comprising:

input means for inputting information including a structure of an autonomous system, parameter values and analysis conditions;

periodic steady-state solution calculating means for calculating a periodic steady-state solution of said autonomous system by using said information inputted from said input means;

noise source adding means for adding a noise source to a periodic linear time-variant system obtained by linearizing said autonomous system around said periodic steady-state solution calculated by said periodic steady-state solution calculating means;

time-variant transfer function calculating means for calculating, for each noise source, a time-variant transfer function of said periodic linear time-variant system to which noise sources are added by said noise source adding means, phase and amplitude noise calculating means for calculating respectively phase noise and amplitude noise of a time-variant transfer function calculated by said time-variant transfer function calculating means; and output means for selectively outputting results of calculations by said periodic steady-state solution calculating means, said time-variant transfer function calculating means and said phase and amplitude noise calculating means, as a result of analysis of noise.

4. A noise analyzing apparatus for an autonomous system according to claim 3, further comprising normalizing means for normalizing phase noise and amplitude noise of a time-variant transfer function obtained by said phase and amplitude noise calculating means, by using periodic steady-state solution from said periodic steady-state solution calculating means.

5. A noise analyzing apparatus for an autonomous system according to claim 4, wherein said output means provides an output to a detuning frequency from an oscillation frequency.

6. A noise analyzing apparatus for an autonomous system according to claim 3, wherein said output means provides an output to a detuning frequency from an oscillation frequency.

7. A noise analyzing apparatus for an autonomous system, comprising:

input means for inputting information including a structure of an autonomous system, parameter values and analysis conditions;

periodic steady-state solution calculating means for calculating a periodic steady-state solution of said autonomous system by using said information inputted from said input means;

noise source adding means for adding a noise source to a periodic linear time-variant system obtained by linearizing said autonomous system around said periodic steady-state solution calculated by said periodic steady-state solution calculating means;

time-variant transfer function calculating means for calculating respectively a first noise component which is outputted after having been converted into a focused frequency from another frequency and a second noise component which is outputted without being frequency converted and for calculating, for each noise source, a time-variant transfer function of said periodic linear time-variant system to which noise sources are added by said noise source adding means;

phase noise calculating means for calculating, for each noise source, power of a portion which contributes to phase noise of a time-variant transfer function relating to said first and second noises calculated by said time-variant transfer function calculating means; and output means for selectively outputting results of calculations by said periodic steady-state solution calculating means, said time-variant transfer function calculating means and said phase noise calculating means, as a result of analysis of noise.

8. A noise analyzing apparatus for an autonomous system according to claim 7, further comprising normalizing means for normalizing phase noise of a time-variant transfer function obtained by said phase noise calculating means, by using periodic steady-state solution from said periodic steady-state solution calculating means.

9. A noise analyzing apparatus for an autonomous system according to claim 8, wherein said output means provides an output to a detuning frequency from an oscillation frequency.

10. A noise analyzing apparatus for an autonomous system according to claim 7, wherein said output means provides an output to a detuning frequency from an oscillation frequency.

11. A noise analyzing apparatus for an autonomous system, comprising:

input means for inputting information including a structure of an autonomous system, parameter values and analysis conditions;

periodic steady-state solution calculating means for calculating a periodic steady-state solution of said autonomous system by using said information inputted from said input means;

noise source adding means for adding a noise source to a periodic linear time-variant system obtained by linearizing said autonomous system around said periodic steady-state solution calculated by said periodic steady-state solution calculating means;

time-variant transfer function calculating means for calculating respectively a first noise component which is outputted after having been converted into a focused frequency from another frequency and a second noise component which is outputted without being frequency converted and for calculating, for each noise source, a time-variant transfer function of said periodic linear time-variant system to which noise sources are added by said noise source adding means;

amplitude noise calculating means for adding, for each noise source, power of a portion which contributes to amplitude noise of a time-variant transfer function relating to said first and second noises calculated by said time-variant transfer function calculating means; and output means for selectively outputting results of calculations by said periodic steady-state solution calculating means, said time-variant transfer function calculating means and said amplitude noise calculating means, as a result of analysis of noise.

12. A noise analyzing apparatus for an autonomous system according to claim 11, further comprising normalizing means for normalizing amplitude noise of a time-variant transfer function obtained by said amplitude noise calculating means, by using periodic steady-state solution from said periodic steady-state solution calculating means.

13. A noise analyzing apparatus for an autonomous system according to claim 12, wherein said output means provides an output to a detuning frequency from an oscillation frequency.

14. A noise analyzing apparatus for an autonomous system according to claim 11, wherein said output means provides an output to a detuning frequency from an oscillation frequency.

15. A computer program product, including a computer readable medium, for analyzing noise for an autonomous system, said computer program product comprising:

input means for inputting information including a structure of an autonomous system, parameter values and analysis conditions in said computer readable medium;

periodic stationary solution calculating means for calculating a periodic steady-state solution of said autonomous system by using said information inputted from said input means in said computer readable medium;

noise source adding means for adding a noise source to a periodic linear time-variant system obtained by linearizing said autonomous system around said periodic steady-state solution calculated by said periodic stationary solution calculating means in said computer readable medium;

time-variant transfer function calculating means for calculating, for each noise source, a time-variant transfer function of said periodic linear time-variant system to which noise sources are added by said noise source adding means in said computer readable medium;

reflected component calculating means for adding power of a time-variant transfer function reflected to a frequency to be observed out of said time-variant transfer functions calculated by said time-variant transfer function calculating means in said computer readable medium; and output means for outputting results of calculations by said periodic stationary solution calculating means, said time-variant transfer function calculating means and said reflected component calculating means, as a result of analysis of noise in said computer readable medium.

16. A computer program product, including a computer readable medium, for analyzing noise for an autonomous system, said computer program product comprising:

input means for inputting information including a structure of an autonomous system, parameter values and analysis conditions in said computer readable medium;

periodic steady-state solution calculating means for calculating a periodic steady-state solution of said autonomous system by using said information inputted from said input means in said computer readable medium;

noise source adding means for adding a noise source to a periodic linear time-variant system obtained by linearizing said autonomous system around said periodic steady-state solution calculated by said periodic steady-state solution calculating means in said computer readable medium;

time-variant transfer function calculating means for calculating, for each noise source, a time-variant transfer function of said periodic linear time-variant system to which noise sources are added by said noise source adding means in said computer readable medium, phase and amplitude noise calculating means for calculating respectively phase noise and amplitude noise of a time-variant transfer function calculated by said time-variant transfer function calculating means in said computer readable medium; and output means for selectively outputting results of calculations by said periodic steady-state solution calculating means, said time-variant transfer function calculating means and said phase and amplitude noise calculating means, as a result of analysis of noise in said computer readable medium.

17. A computer program product, including a computer readable medium, for analyzing noise for an autonomous system, said computer program product comprising:

input means for inputting information including a structure of an autonomous system, parameter values and analysis conditions in said computer readable medium;

periodic steady-state solution calculating means for calculating a periodic steady-state solution of said autonomous system by using said information inputted from said input means in said computer readable medium;

noise source adding means for adding a noise source to a periodic linear time-variant system obtained by linearizing said autonomous system around said periodic steady-state solution calculated by said periodic steady-state solution calculating means in said computer readable medium;

time-variant transfer function calculating means for calculating respectively a first noise component which is outputted after having been converted into a focused frequency from another frequency and a second noise component which is outputted without being frequency converted and for calculating, for each noise source, a time-variant transfer function of said periodic linear time-variant system to which noise sources are added by said noise source adding means in said computer readable medium;

phase noise calculating means for calculating, for each noise source, power of a portion which contributes to phase noise of a time-variant transfer function relating to said first and second noises calculated by said time-variant transfer function calculating means in said computer readable medium; and output means for selectively outputting results of calculations by said periodic steady-state solution calculating means, said time-variant transfer function calculating means and said phase noise calculating means, as a result of analysis of noise in said computer readable medium.

18. A computer program product, including a computer readable medium, for analyzing noise for an autonomous system, said computer program product comprising:

input means for inputting information including a structure of an autonomous system, parameter values and analysis conditions in said computer readable medium;

periodic steady-state solution calculating means for calculating a periodic steady-state solution of said autonomous system by using said information inputted from said input means in said computer readable medium;

noise source adding means for adding a noise source to a periodic linear time-variant system obtained by linearizing said autonomous system around said periodic steady-state solution calculated by said periodic steady-state solution calculating means in said computer readable medium;

time-variant transfer function calculating means for calculating respectively a first noise component which is outputted after having been converted into a focused frequency from another frequency and a second noise component which is outputted without being frequency converted and for calculating, for each noise source, a time-variant transfer function of said periodic linear time-variant system to which noise sources are added by said noise source adding means in said computer readable medium;

amplitude noise calculating means for adding, for each noise source, power of a portion which contributes to amplitude noise of a time-variant transfer function relating to said first and second noises calculated by said time-variant transfer function calculating means in said computer readable medium; and output means for selectively outputting results of calculations by said periodic steady-state solution calculating means, said time-variant transfer function calculating means and said amplitude noise calculating means, as a result of analysis of noise in said computer readable medium.

* * * * *